US006995982B2

(12) United States Patent
Gonzalez et al.

(10) Patent No.: US 6,995,982 B2
(45) Date of Patent: Feb. 7, 2006

(54) SPRING LOADED PLUNGER FOR CIRCUIT BOARD INSTALLATION AND REMOVAL

(75) Inventors: Juan Gonzalez, Round Rock, TX (US); Ralph W. Jensen, Austin, TX (US); Matthew S. McGuff, San Marcos, TX (US); Alex Z. Rodriguez, Round Rock, TX (US); Ty R. Schmitt, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 194 days.

(21) Appl. No.: 10/317,298

(22) Filed: Dec. 12, 2002

(65) Prior Publication Data

US 2004/0114333 A1    Jun. 17, 2004

(51) Int. Cl.
*H05K 5/00* (2006.01)
*H05K 5/04* (2006.01)
*H05K 5/06* (2006.01)

(52) U.S. Cl. ............ 361/758; 361/742; 361/756; 361/759; 361/801; 361/802; 361/803

(58) Field of Classification Search ........... 361/742, 361/758, 752–753, 756, 759, 796, 801–803; 174/52.1, 138 E, 138 G; 257/705, 707, 711
See application file for complete search history.

(56) References Cited

U.S. PATENT DOCUMENTS

| | | | | |
|---|---|---|---|---|
| 4,969,065 A | * | 11/1990 | Petri | 361/804 |
| 5,757,621 A | * | 5/1998 | Patel | 361/719 |
| 6,104,614 A | * | 8/2000 | Chou et al. | 361/704 |
| 6,140,591 A | | 10/2000 | Osborne et al. | |
| 6,262,887 B1 | * | 7/2001 | Lee | 361/683 |
| 6,331,937 B1 | * | 12/2001 | Bartyzel | 361/687 |
| 6,347,042 B1 | * | 2/2002 | White | 361/784 |
| 6,377,445 B1 | * | 4/2002 | Davis et al. | 361/683 |
| 6,404,646 B1 | * | 6/2002 | Tsai et al. | 361/758 |
| 6,493,233 B1 | * | 12/2002 | De Lorenzo et al. | 361/752 |

* cited by examiner

*Primary Examiner*—Amir Zarabian
*Assistant Examiner*—Thanh Y. Tran
(74) *Attorney, Agent, or Firm*—Haynes and Boone, LLP

(57) ABSTRACT

A motherboard is secured in a chassis by a spring loaded plunger. An anchor member is mounted in the chassis. The anchor member includes a ramp and a receiver. The motherboard has an opening formed therein. A first member is secured to the motherboard. A second member is resiliently mounted on the first member so that the second member extends through the opening. The motherboard is moved on the chassis so that the second member is moved in a first direction by engaging the ramp, and the resilient mounting of the second member urges the second member in a second direction into the receiver.

21 Claims, 5 Drawing Sheets

SPRING LOADED PLUNGER FOR CIRCUIT BOARD INSTALLATION AND REMOVAL

BACKGROUND

The present disclosure relates generally to information handling systems, and more particularly to installing and removing a circuit board from such systems without the use of tools.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Previously, a captive thumbscrew was used to install a printed wiring assembly (PWA), i.e., a circuit board or planar, in a computer chassis. The thumbscrew was either snapped-in or press-fit into the circuit board. Both of the designs have their faults. The snap-fit device often popped loose in the factory when a torque gun was used to tighten the thumbscrew down. The press-fit version could locally crack the board during installation at the PWA manufacturer, so a trace keep-out was required around the thumbscrew hole.

One approach has been to provide a plunger stand-off assembly for securing a circuit board to a computer chassis without the need for tools. The plunger stand-off assembly includes an inner component, an outer component, and a spring for causing relative movement between the inner and outer components. The relative movement between the inner and outer components securely fastens the circuit board to the computer chassis. However, this approach is costly and complex.

Therefore, what is needed is a tool-less device for installing and removing a circuit board, which improves upon the previously used devices.

SUMMARY

One embodiment, accordingly, provides a chassis and a motherboard having an opening formed therein. A first member is secured to the motherboard and a second member is carried by the first member. The second member extends through the opening. A resilient member movably interconnects the first and second members for urging the second member through the opening.

A principal advantage of this embodiment is that a tool-less method for installing and removing a circuit board is provided which does not damage the circuit traces.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
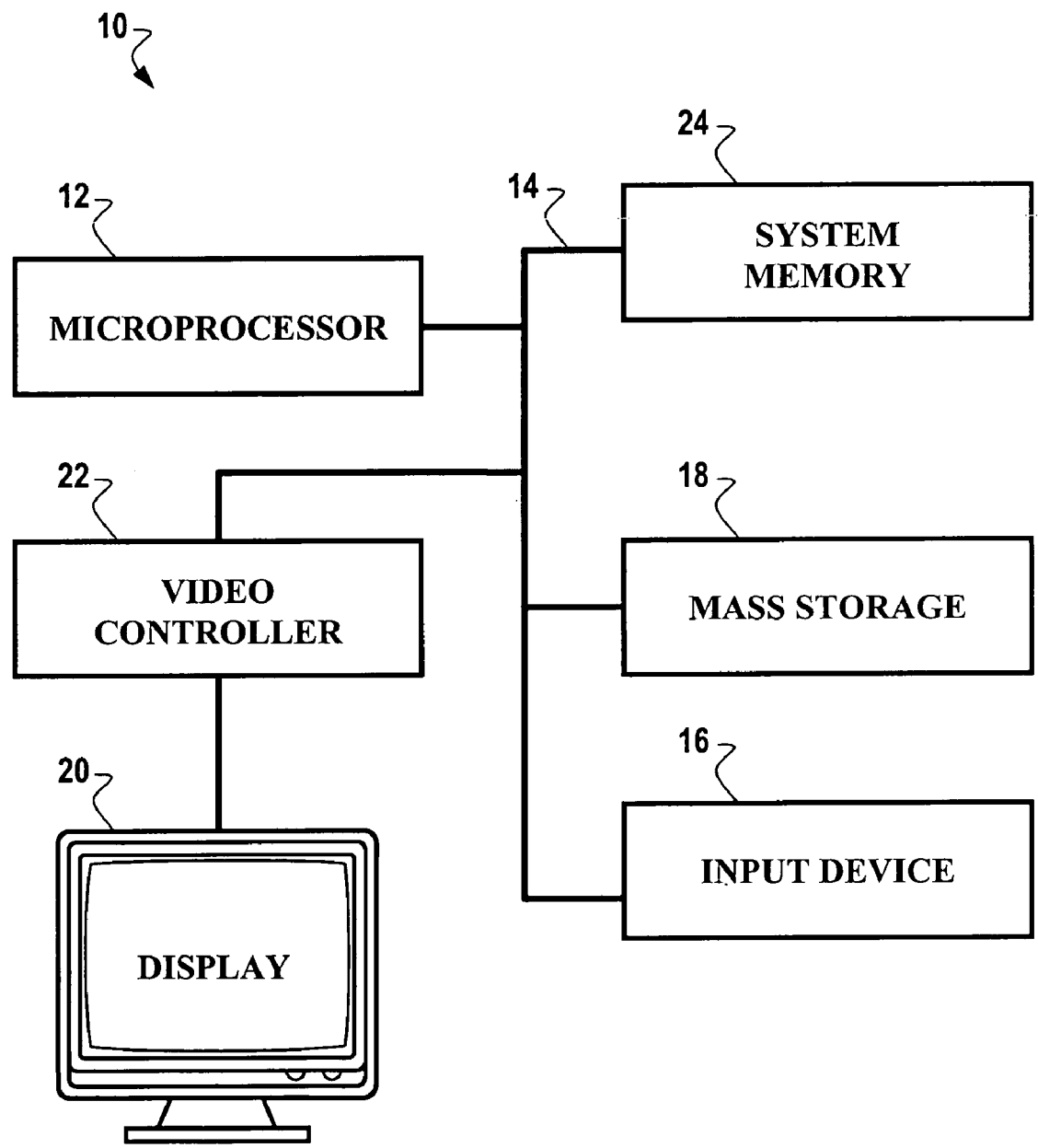
FIG. 1 is a diagrammatic view illustrating an embodiment of a computer system.

In one embodiment, computer system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2:
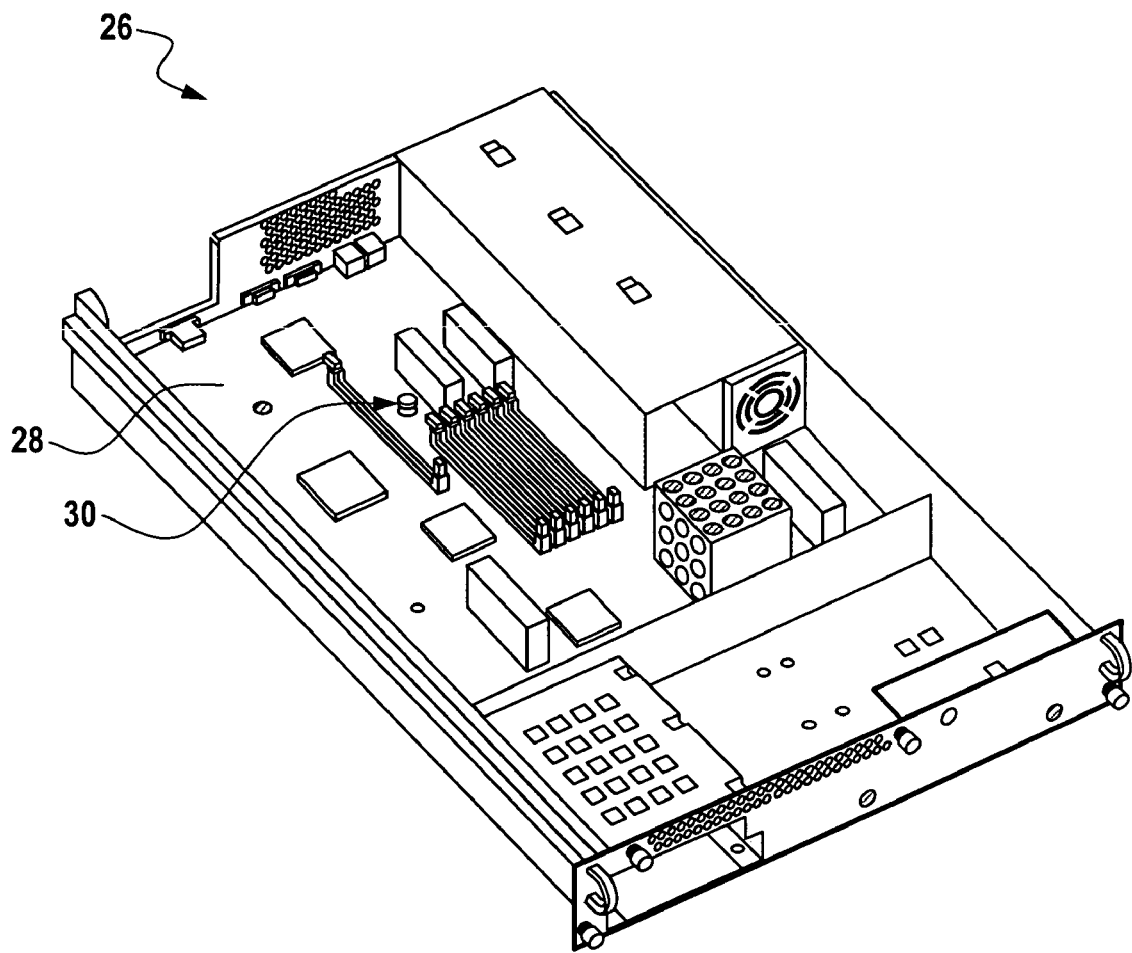
FIG. 2 is a perspective view illustrating an embodiment of a computer chassis.
Figure 3:
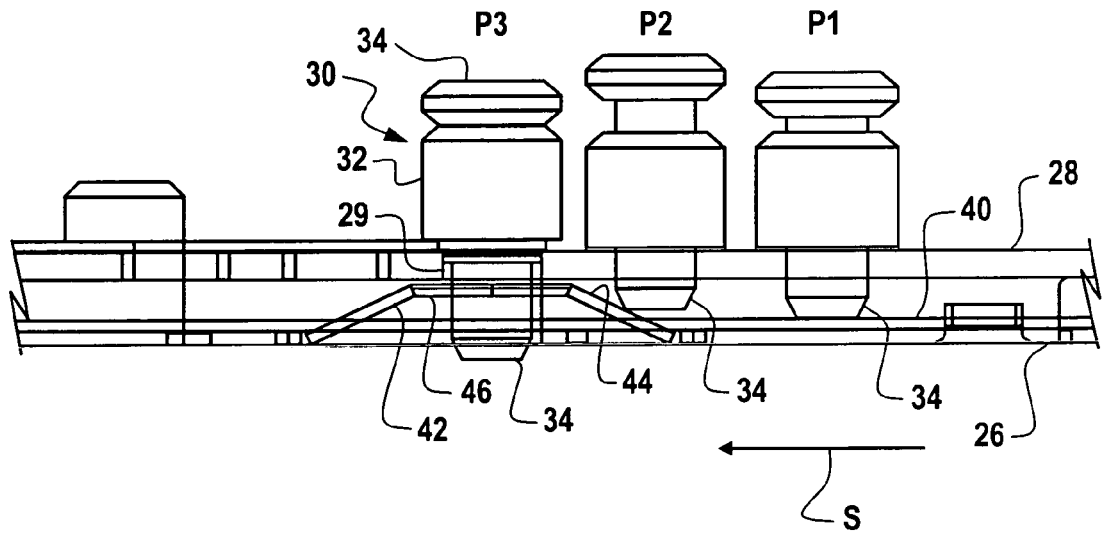
FIG. 3 is a side view illustrating an embodiment of a plunger on a motherboard movably mounted in the chassis.

A computer chassis 26, FIG. 2, includes at least some of the components of computer system 10. A motherboard 28 is slidably mounted in chassis 26 and is secured in the chassis 26 by means of a plunger 30, FIG. 3. The plunger 30 includes a first member 32 secured to the motherboard 28 at an opening 29. A second member 34 is carried by the first member 32. The second member 34 extends through the opening 29. A resilient member 36, FIG. 4, movably interconnects the first and second members 32, 32, respectively, for urging the second member 34 through the opening 29. Plunger 30 may be formed of a suitable metal or synthetic material, or a combination thereof.

Figure 4:
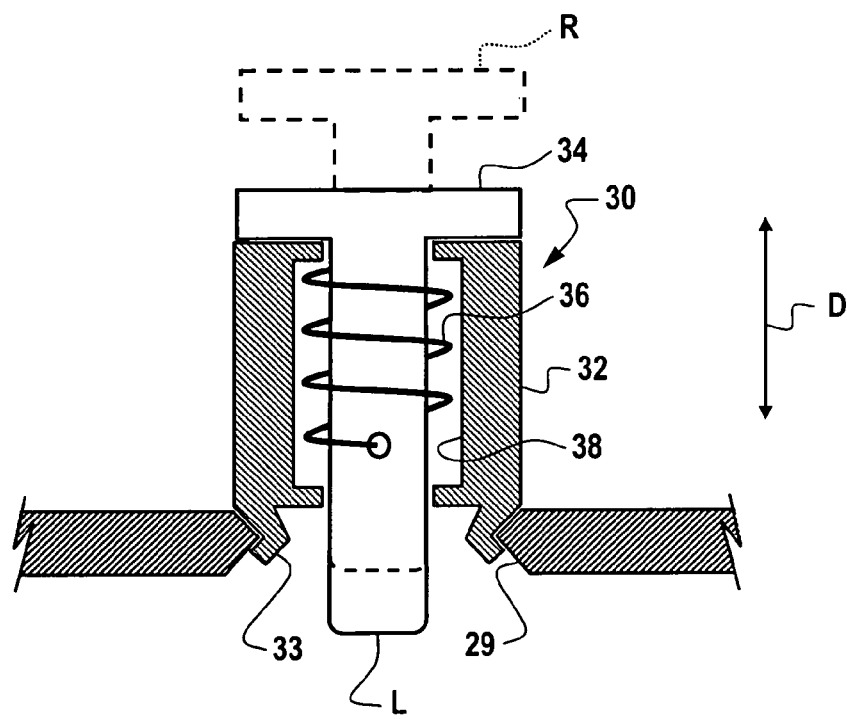
FIG. 4 is a cross-sectional view illustrating an embodiment of the plunger.

The first member 32 may be secured to motherboard 28 in various ways, for example, such as with an adhesive, a press-fit, threaded, soldered or flared at 33, as illustrated in FIG. 4. A bore 38 formed through first member 32 includes the resilient member 36, connected to resiliently load the second member 34. The second member 34 is bi-directionally movable in bore 38 as indicated at D to retract and extend between a raised position R and a lowered position L due to compression of resilient member 36.

Returning to FIG. 3, as motherboard 28 slides in chassis 26 in a direction S, second member 34 of plunger 30 slides along a surface 40 of chassis 26 at P1. An anchor member 42 is mounted in chassis 26, and includes a ramp 44 and a receiver 46 in the form of an opening sized sufficiently to receive second member 34. As plunger 30 contacts ramp 44, second member 34 retracts into first member 32, as described above, and rides up the ramp 44 at P2. As plunger 30 reaches P3, second member 34 aligns with receiver 46 and snaps into receiver 46 to secure motherboard 28 on chassis 26.

Figure 5:
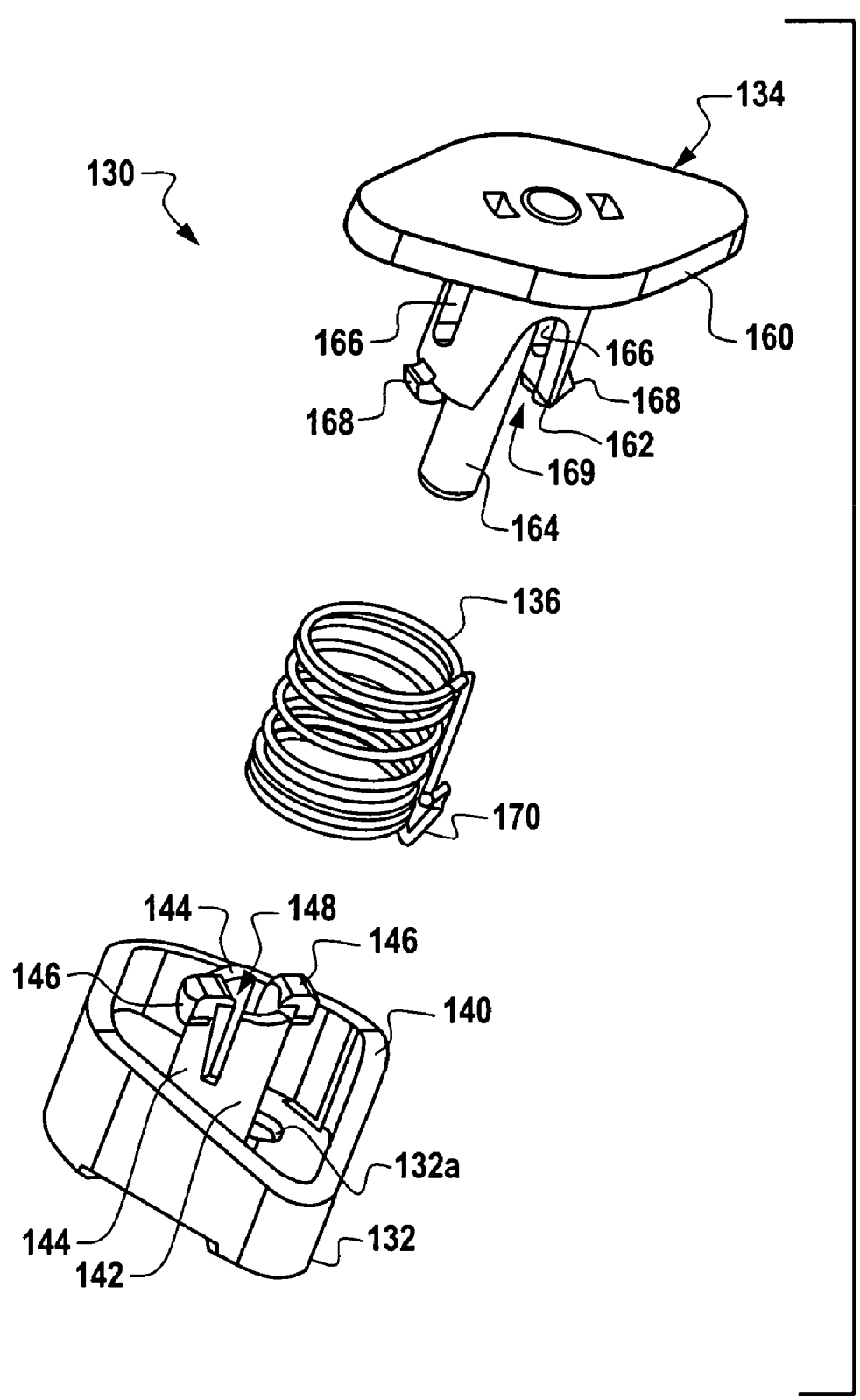
FIG. 5 is an exploded view illustrating an alternate embodiment of the plunger.

As an alternative, a plunger 130, FIG. 5, may be provided. As stated above, material for plunger 130 may be of a suitable metal or synthetic material, or a combination thereof. Plunger 130 includes a first member 132, secured to the motherboard 28 at opening 29, see also FIG. 6. A second member 134 is carried by the first member 132. The second member 134 extends through the opening 29. A resilient member 136, movably interconnects the first and second members 132, 134, respectively, for urging the second member 134 through the opening 29.

Figure 6:
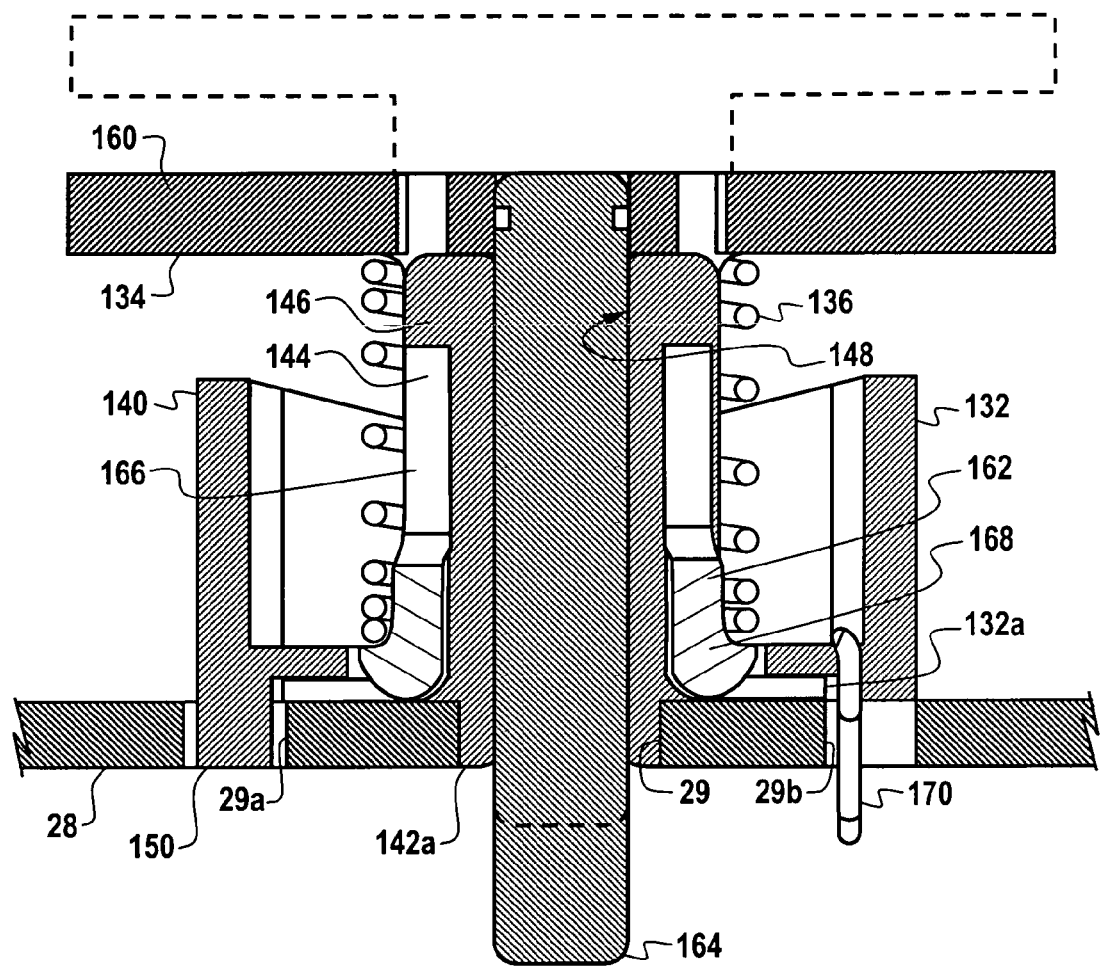
FIG. 6 is a cross-sectional view illustrating the alternate embodiment of the plunger.

More specifically, first member 132, FIGS. 5 and 6, includes a base 140 having a first guide 142 having a plurality of spaced sections 144. At least two of the sections 144 each have a radially extending stop 146 formed thereon. Guide 142 defines a tubular passage 148. Also, a portion of guide 142 is extended at an end 142a for extending into the motherboard 28 at opening 29. A foot 150 which extends from base 140, also extends into the motherboard 28 at another opening 29a. The base 140 may be secured to the motherboard 28 by a suitable adhesive or may be press fit, for example. The attachment of foot 150 and extended end 142a, provides a secure anti-rotation connection between base 140 and motherboard 28. Such attachment may be accomplished by soldering to motherboard 28 if desired.

Second member 134 is generally a T-shaped member having a flange 160, and a tubular guide receiver 162. A dowel 164 may be a separate part of second member 134 in the form of a steel pin or may be a molded part of the second member 134. Dowel 164 extends axially within guide receiver 162. A pair of slots 166 are provided in guide receiver 162, and a pair of spring retainers 168 are provided to extend radially outwardly from guide receiver 162. A concentric space 169 extends between dowel 164 and guide receiver 162.

Resilient member 136 is in the form of a coil spring and has an anchor 170 extending therefrom which extends through an opening 132a in first member 132 and an aligned opening 29b in motherboard 28.

When assembled, dowel 164 extends through tubular passage 148. Radially extending stops 146 are movable in slots 166. Resilient member 136 is seated on spring retainers 168 and coils around guide receiver 162. Anchor 170 extends from resilient member 136 and through the aligned openings 132a and 29b. The function of plunger 130 is the same as the function of plunger 30 as described above.

In the present device, a spring-loaded plunger is used to mount the planar board into the chassis. The plunger greatly reduces the chance of cracking board traces. To assemble the planar in the system, one must simply rest the board on available alignment hooks and push the board back until the plunger snaps into a retaining hole in the chassis. The spring keeps the plunger biased down as it rides over an anchor in the sheet metal and drops into the retaining hole. The plunger makes an audible click, once the board is in the correct position, helping the assemblers know that the board is properly assembled. To remove the board, requires simply pulling up on the plunger and sliding the board toward the front of the chassis.

Additionally, another embodiment includes a spring loaded plunger assembly which would solder directly to the circuit board. This type of plunger is quite inexpensive and small in size. The spring element legs act as the soldering pins. A separable press fit knob of any size or shape could be attached for each application. The spring element could be insert molded into the housing. With the addition of a lead, soldered into the board, a circuit for verifying the plunger position (or proper circuit board installation) can be incorporated. An LED can also be incorporated into this circuit for feedback as to when the circuit board is pushed all the way into it's final position.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A computer chassis comprising:
   a motherboard having an opening formed therein;
   a first member secured to the motherboard, the first member including a base and a guide having a plurality of spaced sections;
   a second member carried by the first member and extending through the opening, the second member including a receiver for receiving the guide, the receiver having at least one slot formed therein and at least one retainer extending therefrom; and
   a resilient member movably interconnecting the first and second members for urging the second member through the opening.

2. The chassis as defined in claim 1 wherein the motherboard is slidably mounted in the chassis.

3. The chassis as defined in claim 2 wherein the chassis includes an anchor member.

4. The chassis as defined in claim 3 wherein the anchor member includes a ramp and a receiver.

5. The chassis as defined in claim 4 wherein in response to sliding engagement with the ramp, the second member moves relative to the first member in a first direction, and in response to alignment with the receiver the second member moves in a second direction opposite the first direction and into engagement with the receiver.

6. The chassis as defined in claim 1 wherein at least two of the sections have a radially extending stop.

7. The chassis as defined in claim 1 wherein the guide defines a tubular passage.

8. The chassis as defined in claim 1 wherein the guide extends into the motherboard.

9. The chassis as defined in claim 8 wherein the guide includes an anti-rotation member extending into the motherboard.

10. The chassis as defined in claim 1 wherein the second member includes a dowel member extending through the guide.

11. The chassis as defined in claim 1 wherein the resilient member is supported on the at least one retainer and includes an extension extending through the motherboard.

12. The chassis as defined in claim 1 wherein the first member is secured to the motherboard by soldering.

13. An information handling system comprising:
a chassis;
a microprocessor mounted in the chassis;
a storage coupled to the microprocessor;
a motherboard mounted in the chassis and having an opening formed therein;
a first member secured to the motherboard, the first member including a base and a guide having a plurality of spaced sections;
a second member carried by the first member, the second member including a receiver for receiving the guide, the receiver having a slot formed therein and a retainer extending therefrom; and
a resilient member movably interconnecting the first and second members for urging the second member through the opening.

14. The system as defined in claim 13 wherein the second member includes a dowel member extending through the guide.

15. The system as defined in claim 13 wherein the resilient member is supported on the at least one retainer and includes an extension through the motherboard.

16. A method of securing a chassis component in a computer chassis comprising:
providing a computer chassis;
mounting an anchor member in the chassis, the anchor member including a ramp and a receiver;
providing a motherboard having an opening formed therein;
securing a first member to the motherboard, the first member including a guide;
resiliently mounting a second member on the first member so that the second member extends through the opening, the second member including a receiver for receiving the guide, the receiver including a slot formed therein and a retainer extending therefrom; and
moving the motherboard on the chassis so that the second member is moved in a first direction by engaging the ramp and the resilient mounting of the second member urges the second member in a second direction into the receiver.

17. The method as defined in claim 16 wherein the securing is provided by soldering.

18. A computer system comprising:
a chassis;
an anchor member mounted in the chassis, the anchor member including a ramp and a receiver;
a motherboard movable on the chassis and having an opening formed therein;
a first member secured to the motherboard, the first member including a guide; and
a second member resiliently mounted on the first member and extending through the opening, the second member including a receiver for receiving the guide, the receiver including a slot formed therein and a retainer extending therefrom, whereby movement of the motherboard on the chassis, moves the second member in a first direction by engaging the ramp, and the resilient mounting urges the second member in a second direction into the receiver.

19. A computer system comprising:
a chassis;
a microprocessor mounted in the chassis;
a motherboard mounted in the chassis and having an opening formed therein;
a first member secured to the motherboard, the first member including a guide;
a second member carried by the first member, the second member including a receiver for receiving the guide, the receiver including a slot formed therein and a retainer extending therefrom; and
a resilient member movably interconnecting the first and second members for urging the second member through the opening.

20. A computer system comprising:
a chassis;
a microprocessor mounted in the chassis;
a motherboard mounted in the chassis and having an opening formed therein;
a first member secured to the motherboard, the first member including a guide;
a second member carried by the first member and extending through the opening, the second member including a receiver for receiving the guide, the receiver including a slot formed therein and a retainer extending therefrom; and
a resilient member movably interconnecting the first and second members for urging the second member through the opening.

21. A computer system comprising:
a chassis;
a microprocessor mounted in the chassis;
a storage coupled to the microprocessor;
an anchor member mounted in the chassis, the anchor member including a ramp and a receiver;
a motherboard movable on the chassis and having an opening formed therein;
a first member secured to the motherboard, the first member including a guide; and
a second member resiliently mounted on the first member and extending through the opening, the second member including a receiver for receiving the guide, the receiver including a slot formed therein and a retainer extending therefrom, whereby movement of the motherboard on the chassis, moves the second member in a first direction by engaging the ramp, and the resilient mounting urges the second member in a second direction into the receiver.

* * * * *